United States Patent [19]

Takada

[11] Patent Number: 5,967,399
[45] Date of Patent: Oct. 19, 1999

[54] ELECTRIC WIRE PRESSURE WELDING APPARATUS AND PRESSURE WELDING METHOD

[75] Inventor: Kazuhiko Takada, Shizuoka, Japan

[73] Assignee: Yazaki Corporation, Tokyo, Japan

[21] Appl. No.: 09/037,006

[22] Filed: Mar. 9, 1998

[30] Foreign Application Priority Data

Mar. 10, 1997 [JP] Japan ................................... 9-054741

[51] Int. Cl.$^6$ .................................................. H01R 43/01
[52] U.S. Cl. ....................... 228/115; 228/173.5; 228/101; 228/212; 29/505; 29/515; 29/520; 29/559
[58] Field of Search ................................ 228/115, 173.5, 228/101, 212; 29/559, 520, 515, 505

[56] References Cited

FOREIGN PATENT DOCUMENTS 7-161437  6/1995  Japan .

Primary Examiner—Patrick Ryan
Assistant Examiner—M. Alexander Elve
Attorney, Agent, or Firm—Armstrong, Westerman, Hattori, McLeland & Naughton

[57] ABSTRACT

An electric wire pressure welding apparatus and pressure welding method capable of exactly specifying the end of an electric wire in a solderless connector and capable of pressure-welding wires from above and below the connector, wherein a wire chuck has a wire holding portion and a pair of wire guide portions projecting from the wire holding portion in a wire-longitudinal direction and having an inner distance larger than a wire diameter for enabling a wire end portion to be disposed between the pair of wire guide portions through which a wire pressure welding blade can go, and wherein the wire guide portions are positioned against a solderless terminal and location of a wire tip is specified by bending the wire end portion about the front end of the wire holding portion in a pressure welding direction by pushing the wire end portion by the wire pressure welding blade. The above wire guide portions on the wire chuck may be replaced with a fixed wire guide extending in the pressure welding direction, wherein the wire is pressure-welded by moving a wire chuck not having the above wire guide portions, in a state of holding the wire, synchronously with the pressure welding blade in the pressure welding direction.

7 Claims, 13 Drawing Sheets

ELECTRIC WIRE PRESSURE WELDING APPARATUS AND PRESSURE WELDING METHOD

BACKGROUND OF THE INVENTION

1. Field of the Invention

The present invention relates to an electric wire pressure welding apparatus and an electric wire pressure welding method which can exactly position the end of an electric wire in a solderless connector.

2. Description of the Prior Art

Figure 15:
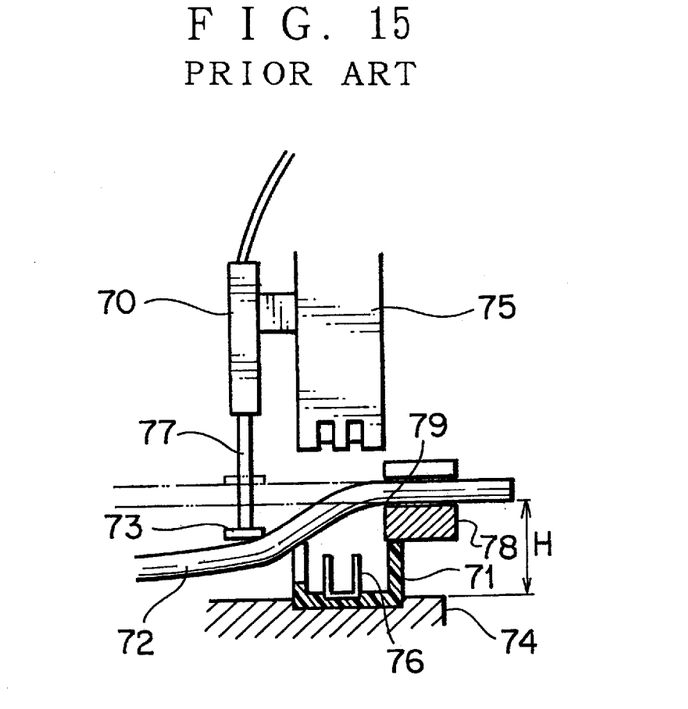
FIG. 15 is a partially sectional side view showing a prior art.
Figure 16:
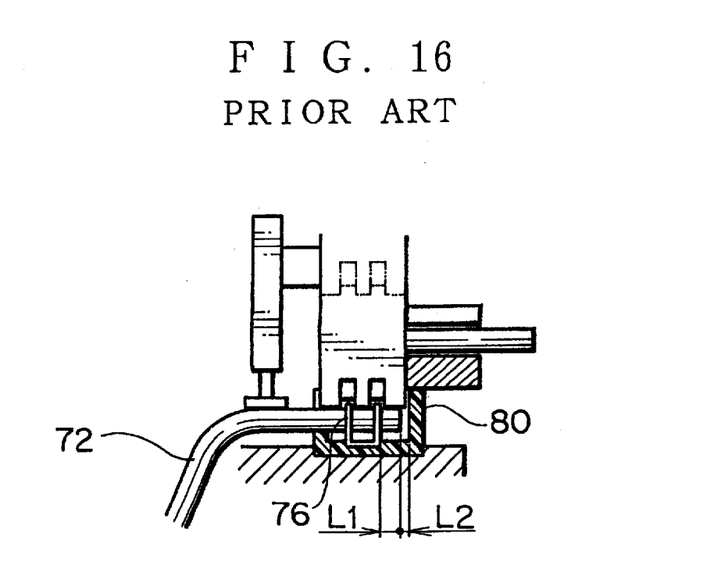
FIG. 16 is a partially sectional side view showing a state of completion of pressure welding of FIG. 15.

FIGS. 15 and 16 show a prior art pressure welding method proposed in Japanese Patent Application No. 5-306472.

In this method, an electric wire 72 is located over a solderless connector 71 and is pushed toward the connector 71 by a wire pushing plate 73 thereby to position the wire 72 on a table 74, and then the wire 72 is pressure-welded to a solderless terminal 76 in the connector 71 by lowering a pressure welding blade 75.

The pressure welding blade 75 moves vertically by means of a cylinder (not shown) and the wire pushing plate 73 is fixed to a rod 77 of a pneumatic cylinder 70. The wire 72 is cut by a cutter 79 on a wire holding member 78 just before pressure welding and then pressure-welded with keeping marginal length L1 from the terminal 76 as shown in FIG. 16 and, at the same time, specifying a little space L2 from an inner wall of a connector housing 80. The marginal length L1 is necessary for a strong connection.

It has been, however, difficult to apply the above prior art method to a case with a large distance H between the wire 72 and the table 74, that is, to a case of a connector housing with large height, since an electric wire is apt to go back or to deflect right or left after being cut. Further, it is impossible to apply this method to an upward or lateral pressure welding since the gravity acts on the wire.

SUMMARY OF THE INVENTION

An object of the present invention is to provide an electric wire pressure welding means which can exactly specify location of the end of an electric wire and surely pressure-weld the wire even in case that a large distance between the wire and a solderless connector exists upon pressure-welding the wire or that the wire is pressure-welded to the connector upwardly or laterally.

To achieve the above object as a first feature of the present invention, the present invention adopts an electric wire pressure welding apparatus having a wire pressure welding blade and a wire chuck which are capable of moving in up and down directions, wherein the wire chuck has a wire holding portion and a pair of wire guide portions each projecting from the wire holding portion in a wire-longitudinal direction and having an inner distance larger than a wire diameter, a wire end portion is disposed between the pair of wire guide portions, and the above wire pressure welding blade can go through the pair of wire guide portions.

And, as a second feature of the present invention, the present invention adopts an electric wire pressure welding apparatus having a wire pressure welding blade and a wire chuck which are capable of moving in up and down directions, wherein the wire chuck can move synchronously with the wire pressure welding blade in the same directions. It is also effective that a wire guide, extending in a moving direction of the wire pressure welding blade, is provided between the wire pressure welding blade and the wire chuck, wherein an electric wire can move along the wire guide in the moving direction of the blade.

Further, the present invention adopts an electric wire pressure welding method using the above electric wire pressure welding apparatus with the first feature of the present invention, wherein the wire guide portions are positioned against a solderless terminal and location of a wire tip is specified by means of bending the wire end portion about the front end of the wire holding portion in a pressure welding direction by pushing the wire end portion by the wire pressure welding blade.

Still further, the present invention adopts an electric wire pressure welding method using the above electric wire pressure welding apparatus with the second feature of the present invention, wherein the electric wire is pressure-welded by moving the wire chuck, holding the electric wire, synchronously with the wire pressure welding blade in a pressure welding direction.

According to the present invention as described above, since the wire end portion bends about the front end of the wire holding portion of the wire chuck in the pressure welding direction, location of the wire tip can be exactly specified in a solderless connector and wire's marginal length for pressure welding can be exactly kept. And, since the wire end portion is positioned by being directly pressed by the wire pressure welding blade, the end portion comes into a stable position, which enables end portions to be pressure-welded not only from above but also from below the connector.

Further, since the electric wire is shifted to just over the solderless connector in a horizontally straight state synchronously with the wire pressure welding blade, location of the wire tip can be exactly specified and also locational deflection does not arise, whereby pressure welding can be surely performed Still further, since the wire end portion can be exactly positioned without swinging right and left, positioning of the wire tip and sureness of pressure welding still improve. And, since the wire can be positioned without being pressed to the solderless connector and is supported stable in any of vertical or horizontal direction by the wire guide, pressure welding from any of vertical or horizontal direction becomes possible.

DETAILED DESCRIPTION OF THE PREFERRED EMBODIMENTS

Figure 1:
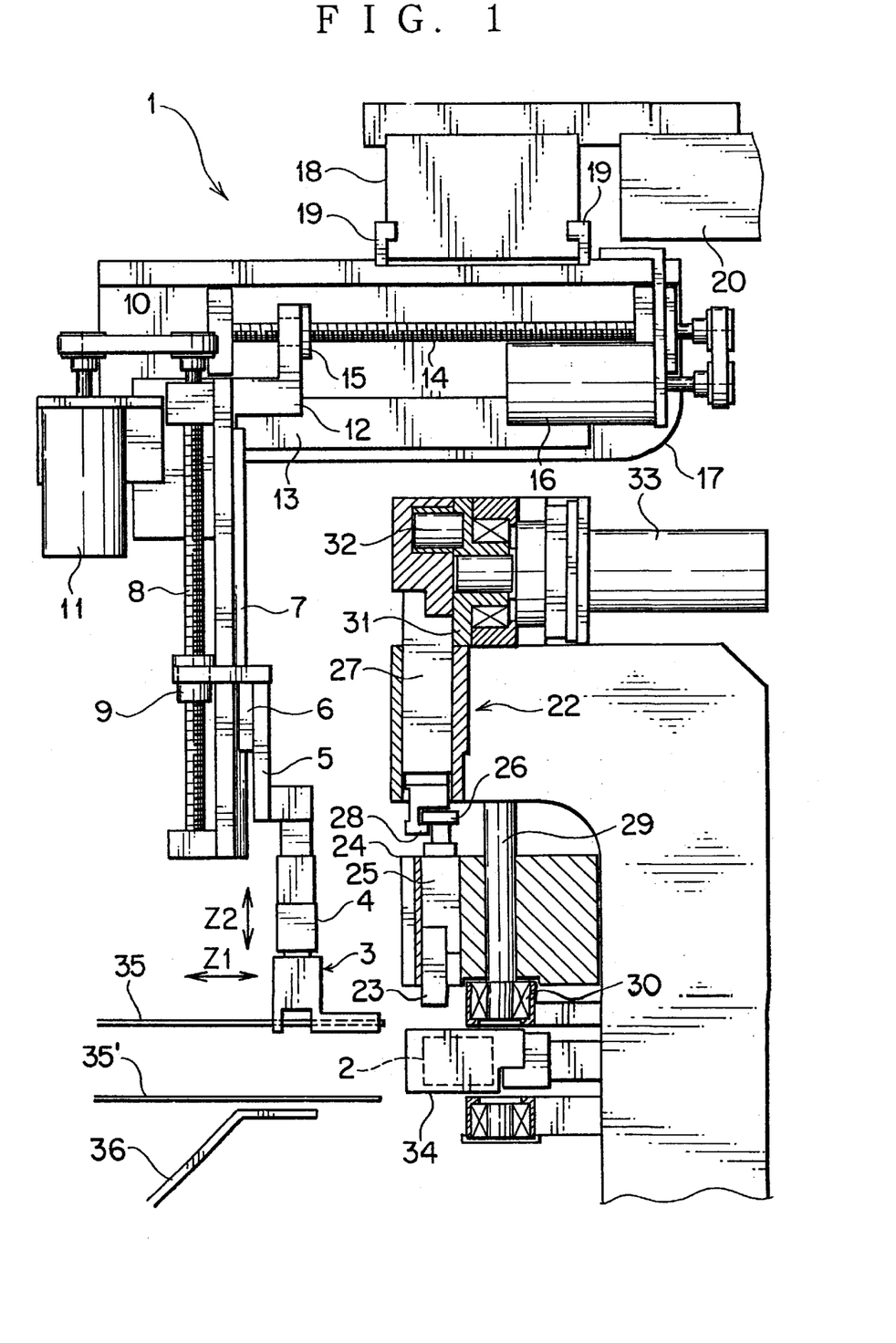
FIG. 1 is a partially sectional longitudinal-side view showing an embodiment of an electric wire pressure welding apparatus in accordance with the present invention.

FIG. 1 shows an embodiment of an electric wire pressure welding apparatus according to the present invention.

Figure 3:
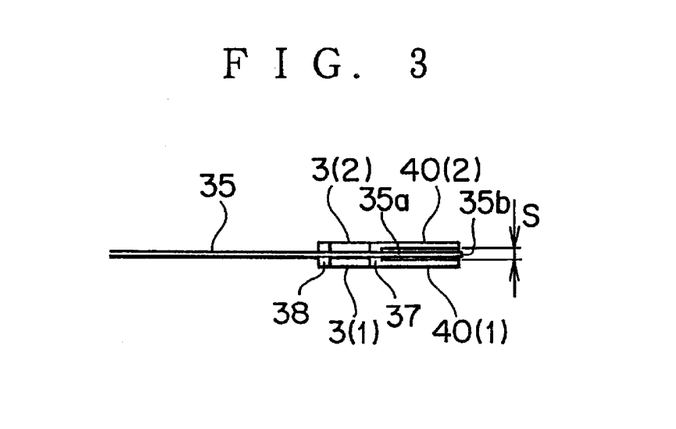
FIG. 3 is a bottom view showing a state of holding an electric wire with the wire chuck of FIG. 2A.

The electric wire pressure welding apparatus is provided with a pair, right and left of wire chucks 3 (i.e. 3(1) and 3(2) in FIG. 3) movable back and forth (in a direction Z1) and vertically (in another direction Z2) with respect to a solderless connector 2.

The chuck 3 is connected to a pneumatic chuck cylinder 4 with a freely opening and closing mechanism, and the chuck cylinder 4 engages a vertical guide rail 7 through a bracket 5 and a slider 6 vertically slidably by means of a vertical ball-screw shaft 8 and a nut portion 9. The ball-screw shaft 8 is rotated by a servo-motor 11 with a belt 10 thereby to move the wire chuck 3 vertically.

The guide rail 7, ball-screw shaft 8 and servo-motor 11 are fixed to a base plate 12 which engages a guide rail 13 slidably back and forth by means of a horizontal ball-screw shaft 14 and a nut portion 15. The ball-screw shaft 14 is rotated by a servo-motor 16 with a belt thereby to move the wire chuck 3 back and forth.

The guide rail 13, ball-screw shaft 14 and servo-motor 16 are fixed to another base plate 17 which engages a guide rail 18 slidably right and left (in a direction perpendicular to the sheet surface) through a slider 19. The guide rail 18 is fixed to a frame 20. The base plate 17 is capable of moving right and left by means of a driving means (not shown) thereby to move the wire chuck 3 right and left A pressure welder 22 with a vertically long pressure welding blade 23 is installed against the wire chuck 3. The pressure welding blade 23 is fixed to a vertical slider 25 on an applicator 24 whose shank 26 engages a nail-portion 28 of an upper vertical slider 27. The applicator 24 of this embodiment is provided with a shaft 29 and a bearing 30 for equipping with kinds of wire pressure welding blades 23. The vertical slider 27 moves up and down due to circular motion of an eccentric shaft 32 of a rotor 31 driven by a servo-motor 33.

The solderless connector 2 with solderless terminals is arranged under the pressure welding blade 23. A plurality of solderless connectors 2 are set in parallel on a horizontally long connector holder 34. The same pressure welder 22 is arranged symmetrically under the connector 2 so that electric wires 35,35' can be pressure-welded to upper and lower sides of the connector 2, respectively. Reference numeral 36 indicates a cover for an electric wire's guide. Structure of the above pressure welder 22 and the connector holder 34 has been proposed, for example, in Japanese Patent Application No. 8-124967.

Figure 2A:
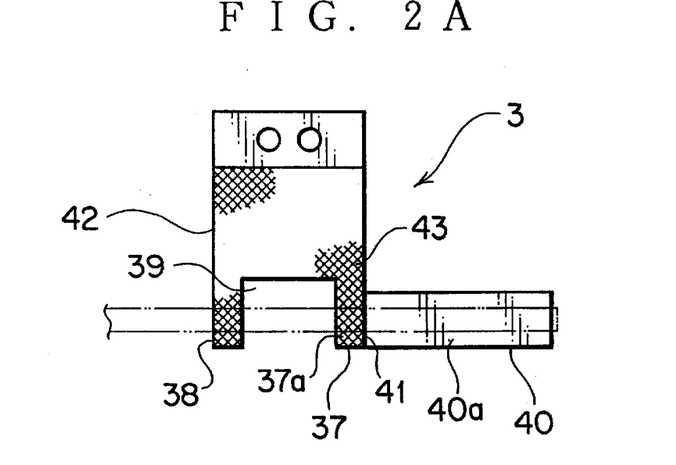
FIG. 2A is a side view showing an example of a wire chuck.
Figure 2B:
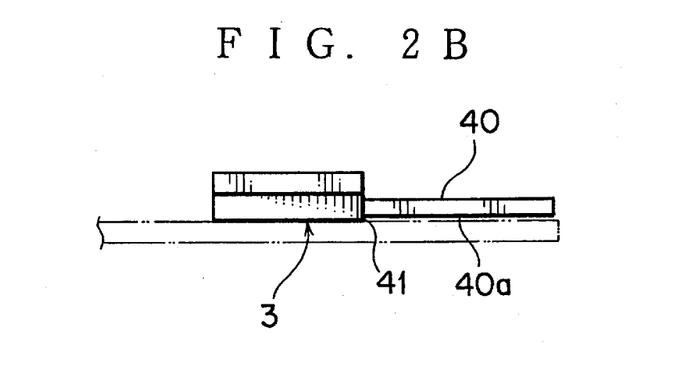
FIG. 2B is a bottom view of FIG. 2A.

FIGS. 2A and 2B show the above wire chuck 3. The wire chuck 3 has front and rear wire holding legs (wire holding portions) 37,38, a ⊔-shaped space 39 between the legs 37,38, and a wire guide portion 40, in a shape of holizontally long rectangule, projecting forwardly from the front leg 37 and located outside the leg 37. A step 41 (FIG. 2B) is formed between a guide surface 40a of the wire guide portion 40 and a holding surface 37a of the leg 37. Double-cut knurl 43 is formed on the legs 37,38 and on a plate portion 42 above the legs 37,38.

As shown in FIG. 3, an inner distance S between a pair of wire guide portions 40(1),40(2) is set a little larger than a wire diameter in a state that the electric wire 35 is held by the legs 37,38 of a pair of wire chucks 3(1),3(2) so that the wire guide portions 40(1),40(2) do not hold the electric wire 35, slightly being in contact with the wire 35. A wire end portion 35a can swing vertically between the pair of wire guide portions 40(1),40(2). In this embodiment, the wire tip 35b slightly projects forwardly over the wire guide portion 40.

Figure 4:
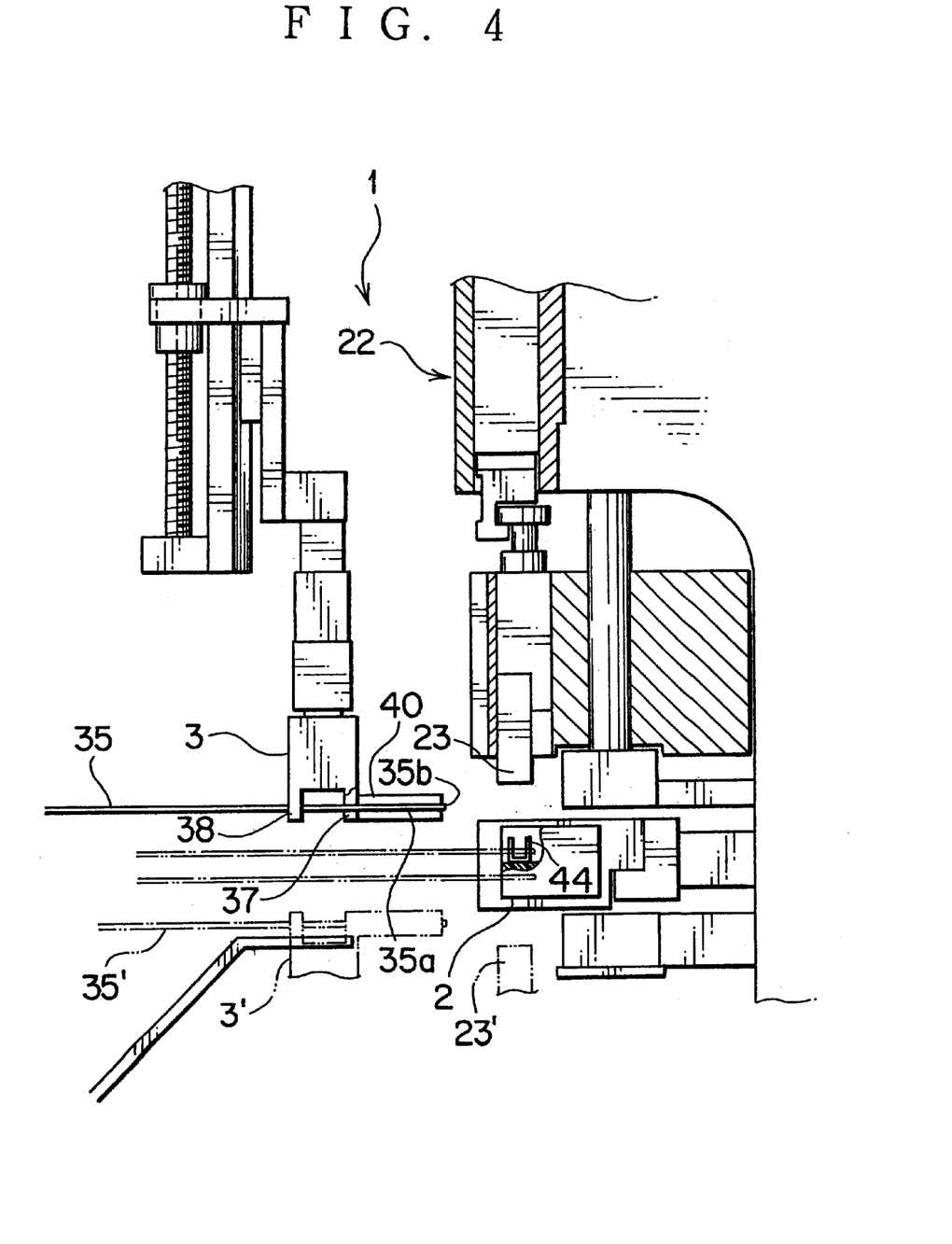
FIG. 4 is a partially sectional side view showing main elements of the apparatus of FIG. 1 in a state of chucking an electric wire.
Figure 5:
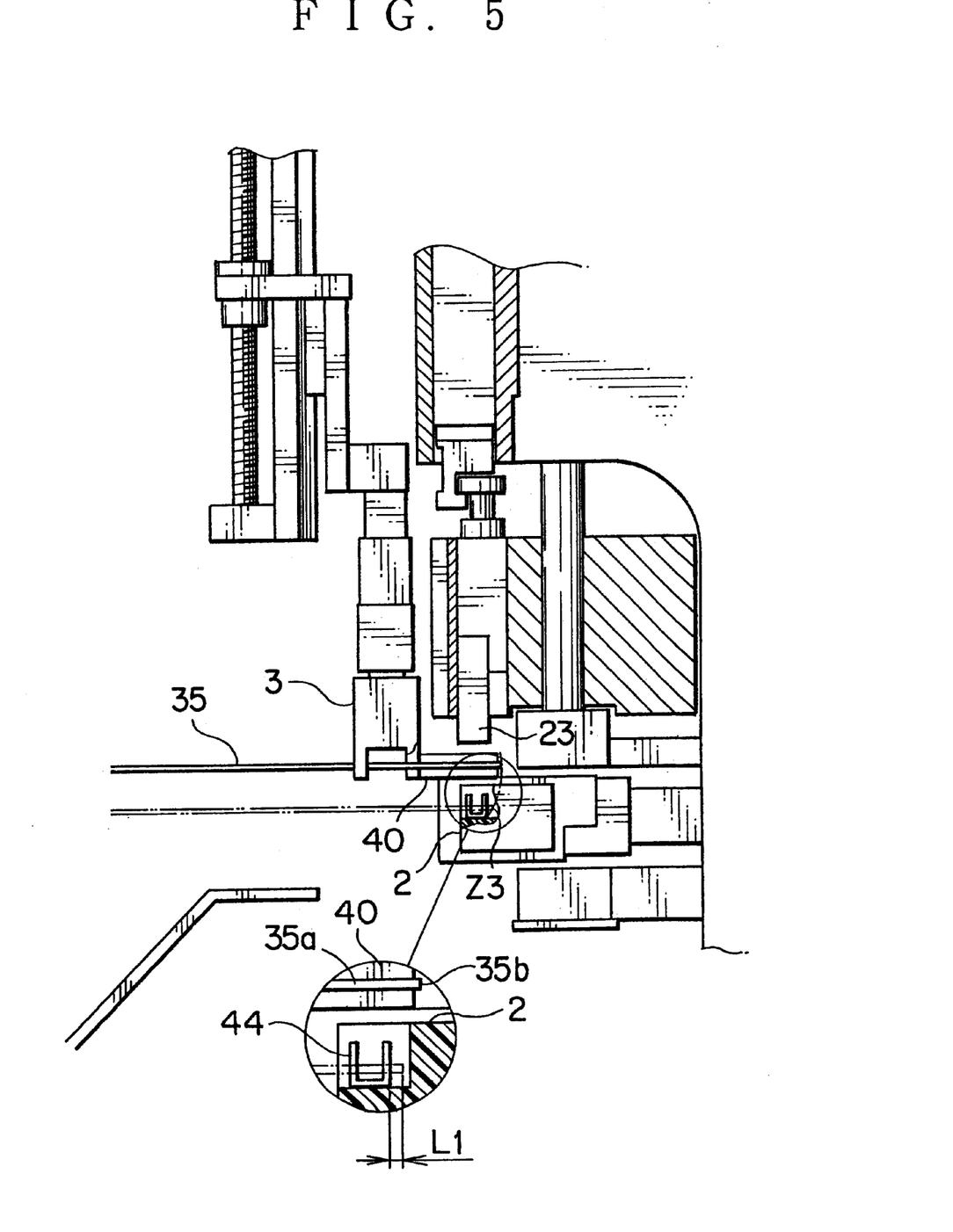
FIG. 5 is a partially sectional side view showing a state of the wire chuck of FIG. 4 being advanced closer to a connector.
Figure 6:
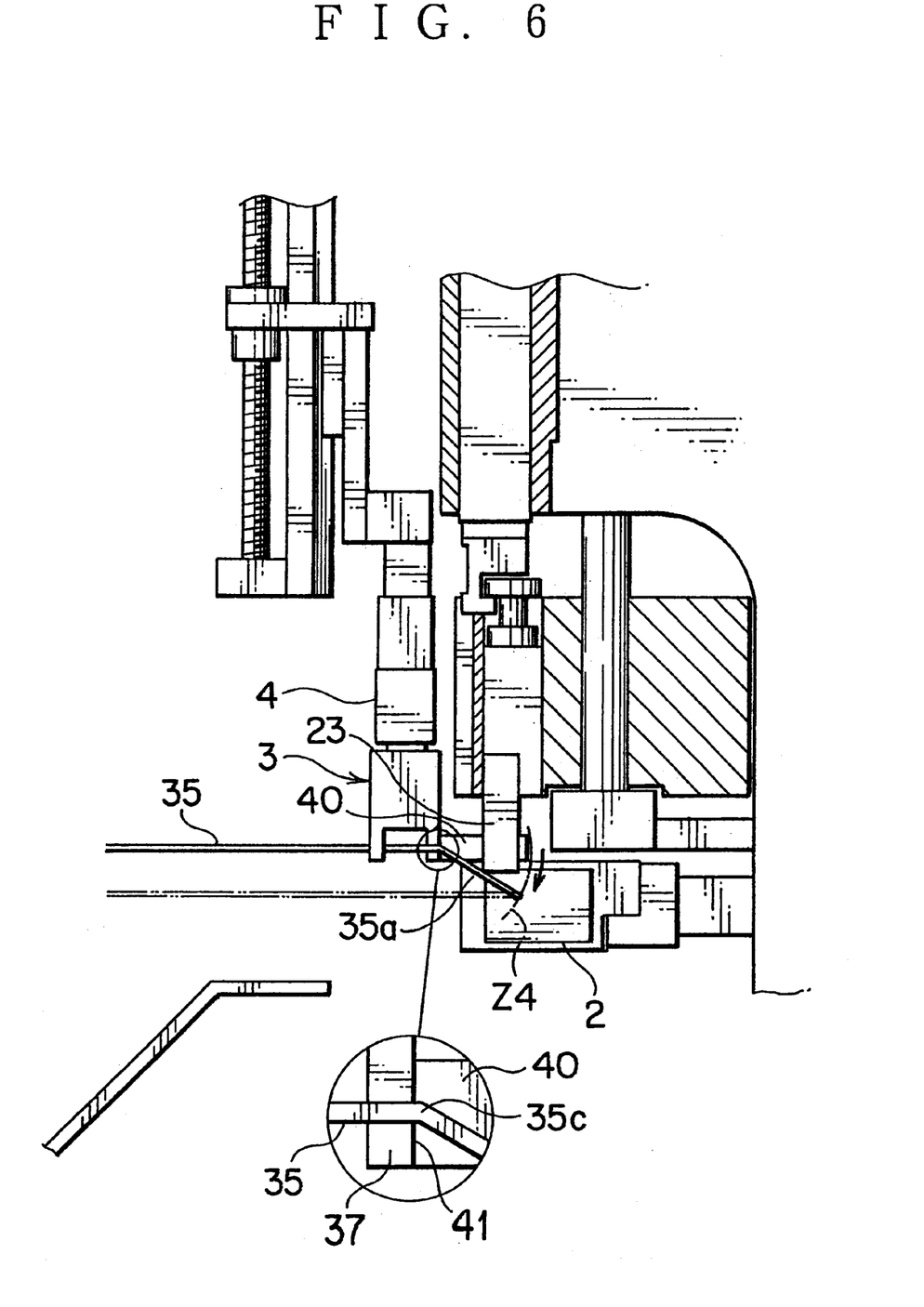
FIG. 6 is a partially sectional side view showing a state of starting pressure welding.

FIGS. 4 through 6 show operation of the above electric wire pressure welding apparatus 1 and also pressure welding method of an electric wire using the apparatus 1.

FIG. 4 shows the same state as FIG. 1, and the wire chuck 3 is located in diagonal front of the connector 2, holding the electric wire 35. Though wire chucks 3,3' and pressure welding blades 23,23' are arranged at upper and lower positions, movement of the upper wire chuck 3 and the upper pressure welding blade 23 is described here. The pressure welding blade 23 is located over the connector 2.

In this state, the wire chuck 3 shifts forward as shown in FIG. 5 with an action of the horizontal ball-screw shaft 14 shown in FIG. 1 thereby to position the wire guide portion 40 closely over the connector 2. The wire guide portion 40 is positioned between the connector 2 and the pressure welding blade 23. The wire tip 35b is projects forwardly a little from a pressure welding point Z3.

Next, the pressure welding blade 23 descends as shown in FIG. 6 with drive of the servo-motor 33 shown in FIG. 1. The pressure welding blade 23 pushes downward the wire end portion 35a disposed between the pair of wire guide portions 40. The wire end portion 35a, whose one end is supported by the front leg 37, is pushed down to a solderless terminal 44 (FIG. 7A) by the pressure welding blade 23, as being guided by the wire guide portions 40.

The wire end portion 35a bends about the leg 37 as a supporting point, and the wire tip 35b circles in a direction Z4 and is exactly disposed on an assigned position in the connector 2. The wire end portion 35a with pressure by the blade 23 is supported by a front terminal piece 44a of the solderless terminal 44 in the connector 2, for example, as shown in FIG. 7A, while positioned on a pair, back and forth, of terminal pieces 44a,44b as shown in FIG. 7B.

Figure 7A:
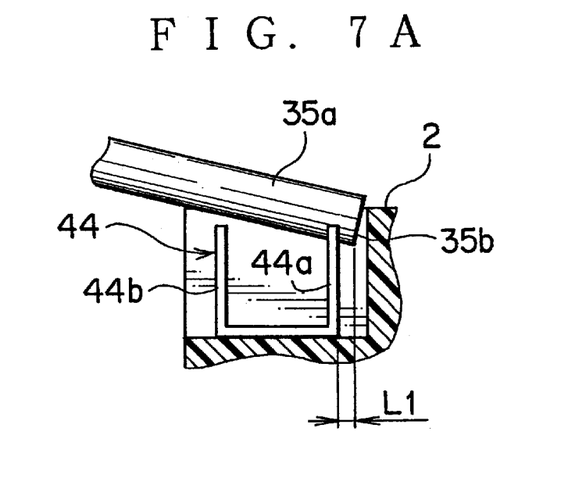
FIG. 7A is a sectional view showing a state of positioning a wire tip on a connector, as an example of an electric wire pressure welding method.
Figure 7B:
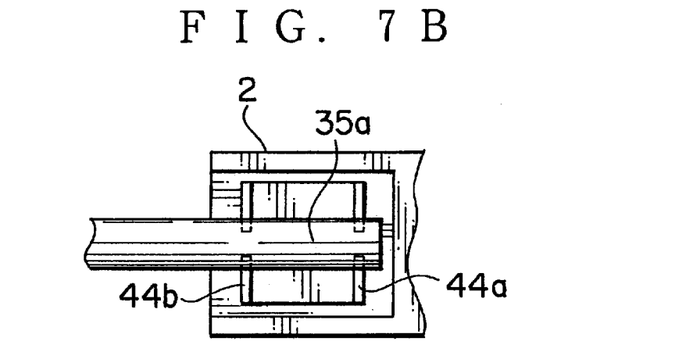
FIG. 7B is a plan view of FIG. 7A.
Figure 7C:
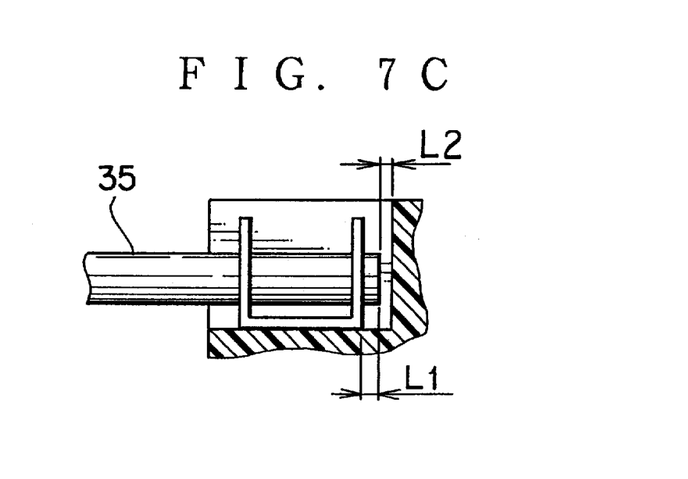
FIG. 7C is a sectional view showing the wire of FIG. 7A in a state of completion of pressure welding.

In this state, the electric wire 35 is released by opening the wire chuck 3 with an action of the chuck cylinder 4 (FIG. 6) and is pressed by the pressure welding blade 23 and is pressure-welded to the solderless terminal 44 as shown with chain line in FIGS. 6 and 7C.

In this embodiment, wire's marginal length L1 for pressure welding in FIGS. 5,7A and 7C can be obtained by positioning the wire tip 35b forwardly beyond the terminal 44, while a space L2 in FIG. 7C is specified by pressing the wire tip 35b to the front terminal piece 44a of the terminal 44.

FIGS. 8 through 14 show another embodiment of an electric wire pressure welding apparatus and pressure welding method according to the present invention.

An electric wire pressure welding apparatus 47 features a pair of wire chucks 48 of a different type from the previous embodiment and a wire guide 49 forwardly disposed against the wire chucks 48. Since the other structure is the same as the previous embodiment, basically the same reference numerals are alloted to the corresonding elements.

Figure 9A:
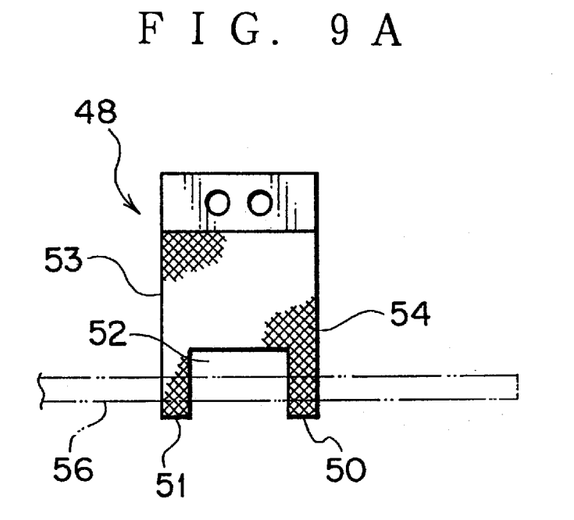
FIG. 9A is a side view showing an example of a wire chuck.
Figure 9B:
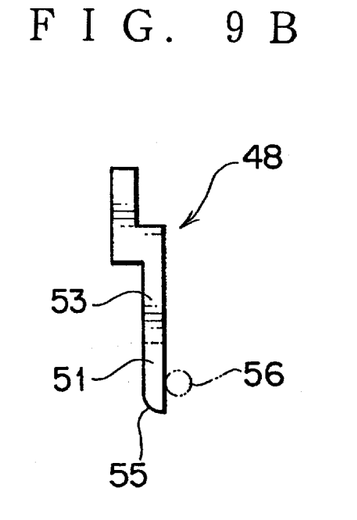
FIG. 9B is a front view of FIG. 9A.

As shown in FIGS. 9A and 9B, the wire chuck 47 has front and rear wire holding legs (wire holding portions) 50,51 to hold an electric wire 56. Though a ⊔-shaped space 52 is formed between the legs 50,51, this is not indispensable. Double-cut knurl 54 is formed on the legs 50,51 and on a plate portion 53. A curved surface 55 is formed at the outer end of the legs 50,51 to avoid an interference with adjoining wires already pressure-welded.

Figure 10:
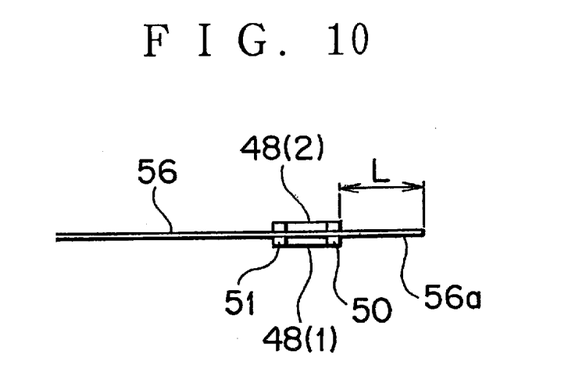
FIG. 10 is a bottom view showing the wire chuck of FIG. 9A holding an electric wire.

As shown in FIG. 10, the electric wire 56 projects from the front leg 50 by specified length L in a state of being held by a pair of wire chucks 48(1),48(2).

Figure 8:
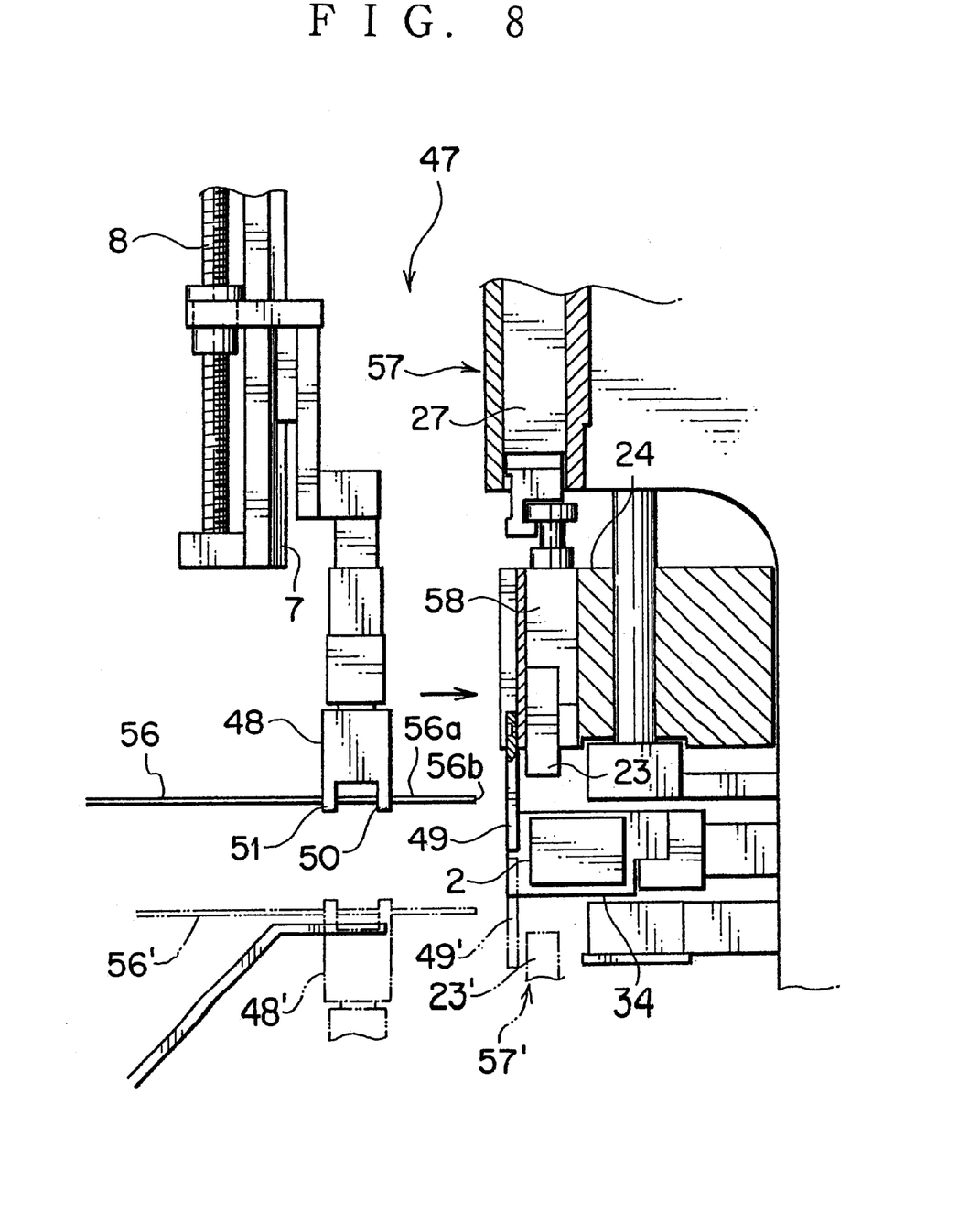
FIG. 8 is a partially sectional longitudinal-side view showing main elements of another embodiment of an electric wire pressure welding apparatus.

Referring to FIG. 8, the above wire guide 49 is fixed to an end of an applicator 24 having an pressure welding blade 23 and faces one end of a solderless connector 2 and also faces a wire tip 56b. Wire chucks 48,48', wire guides 49,49' and pressure welding blades 23,23' are arranged at upper and lower positions, respectively, with respective upper and lower pressure welder 57,57', and electric wires 56,56' are supported by the upper and lower wire chucks 48,48', respectively. The wire guide 49 may be installed integrally with a slider 58 of the applicator 24 or with the pressure welding blade 23. Only the upper structure will be described hereinafter.

Figure 11A:
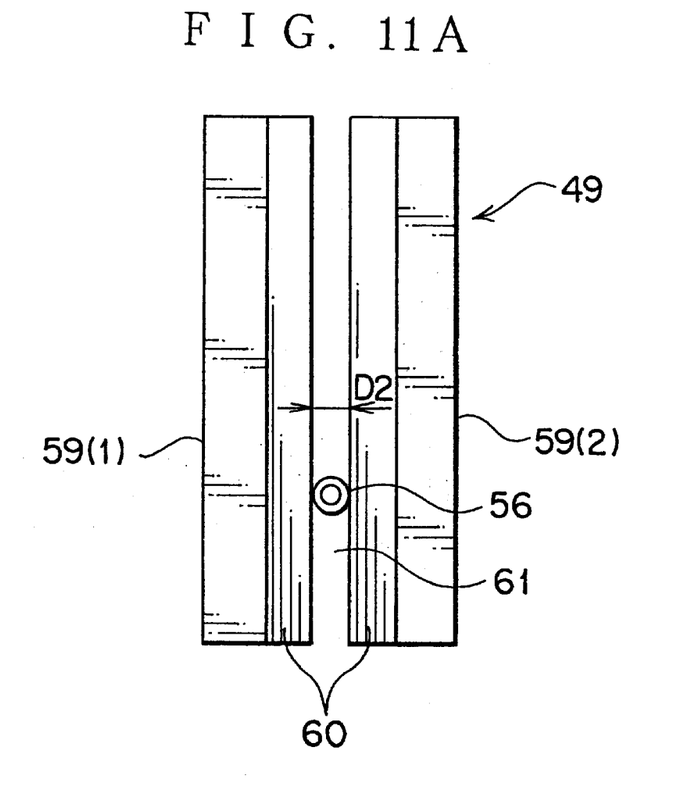
FIG. 11A is a front view showing a wire guide.
Figure 11B:
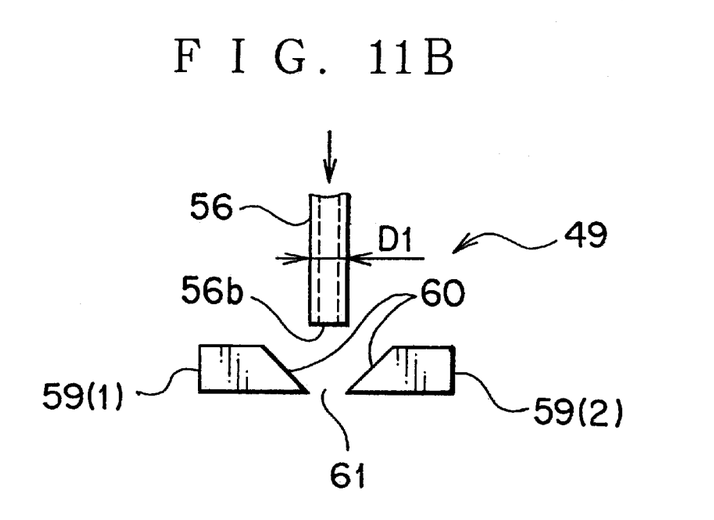
FIG. 11B is a plan view of FIG. 11A.

As shown in FIGS. 11A and 11B, the wire guide 49 consists of a pair of guide covers 59(1),59(2) which have respective tapered guide planes 60, and a wire through slit 61 is formed between the tapered guide planes 60. The tapered guide planes 60 is located against a wire tip 56b. The wire through slit 61 has an inner width D2 a little wider than a wire diameter D1.

In FIG. 8, the wire 56 is held by the wire chuck 48 and is positioned in the rear and a little upper side of the connector 2. The wire chuck 48 can move verically along a vertical guide rail 7 and a ball-screw shaft 8 like shown in FIG. 1 in the previous embodiment. And, the pressure welding blade 23 moves vertically integrally with a vertical slider 27 driven by a servo-motor 33 also like FIG. 1.

Figure 12:
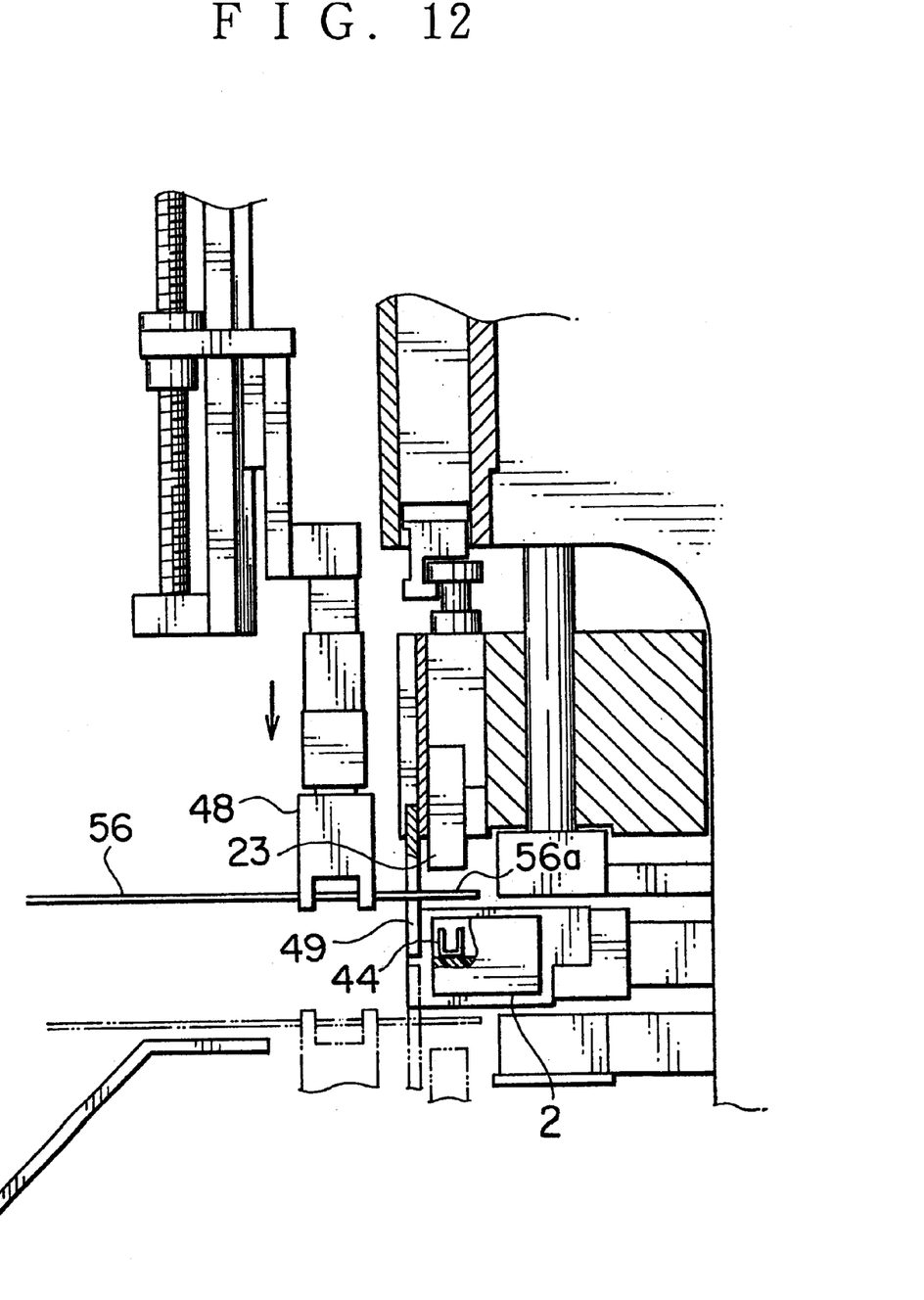
FIG. 12 is a partially sectional side view showing a state of the wire chuck of FIG. 8 being advanced closer to a connector.

From a state of FIG. 8, the wire chuck 48 proceeds as shown in FIG. 12 by an action of a horizontal ball-screw shaft 14 and of a guide rail 13 as in FIG. 1, and then a wire end portion 56a in front of the chuck 48 is put through the wire guide 49 and is positioned over the connector 2. The wire end portion 56a is guided into the slit 61 along the tapered guide planes 60 (FIG. 11B) of the wire guide 49 and positioned over a solderless terminal 44 accommodated in the connector 2. The pressure welding blade 23 is arranged over the wire 56.

Figure 13:
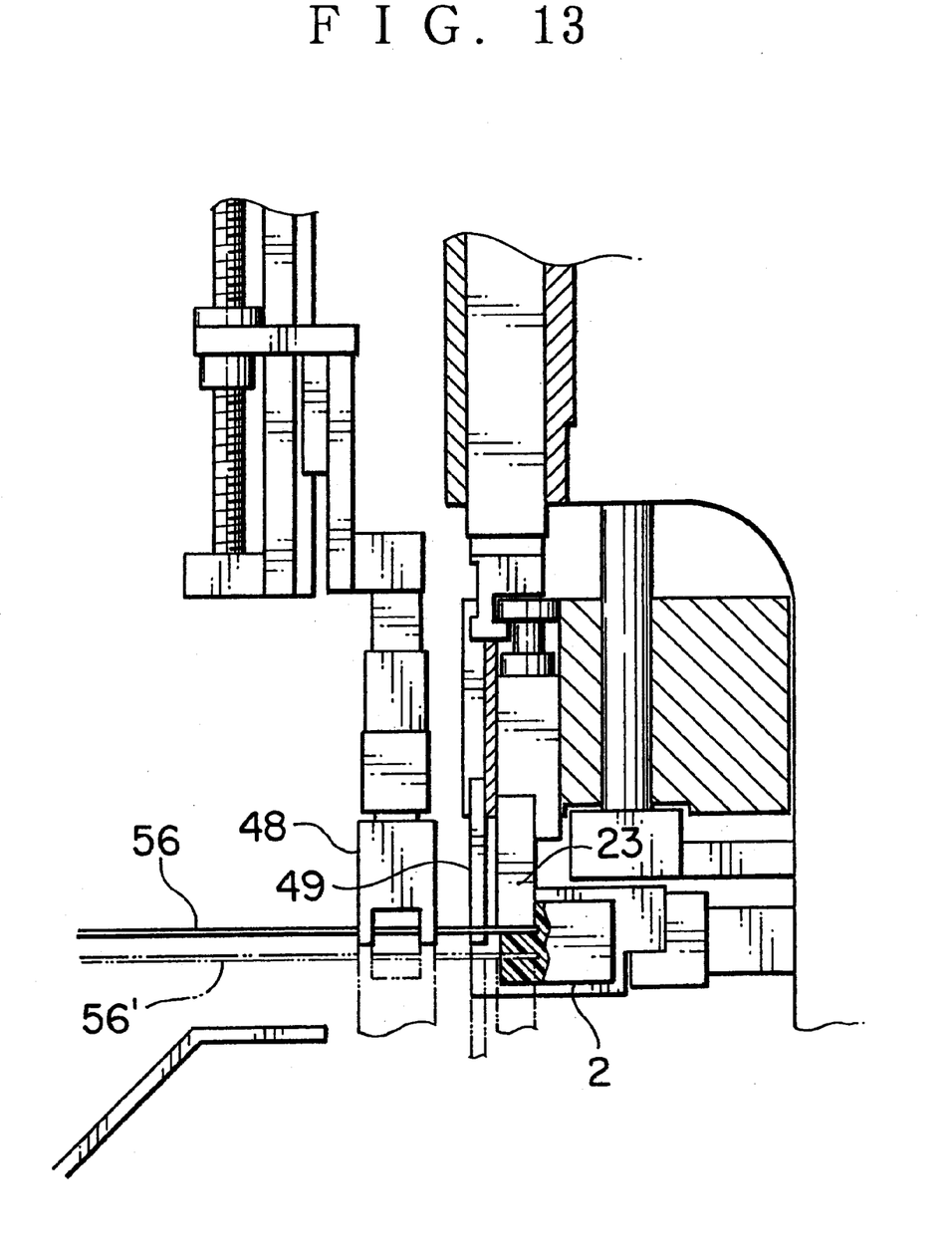
FIG. 13 is a partially sectional side view showing a state of completion of pressure welding of the wire.
Figure 14A:
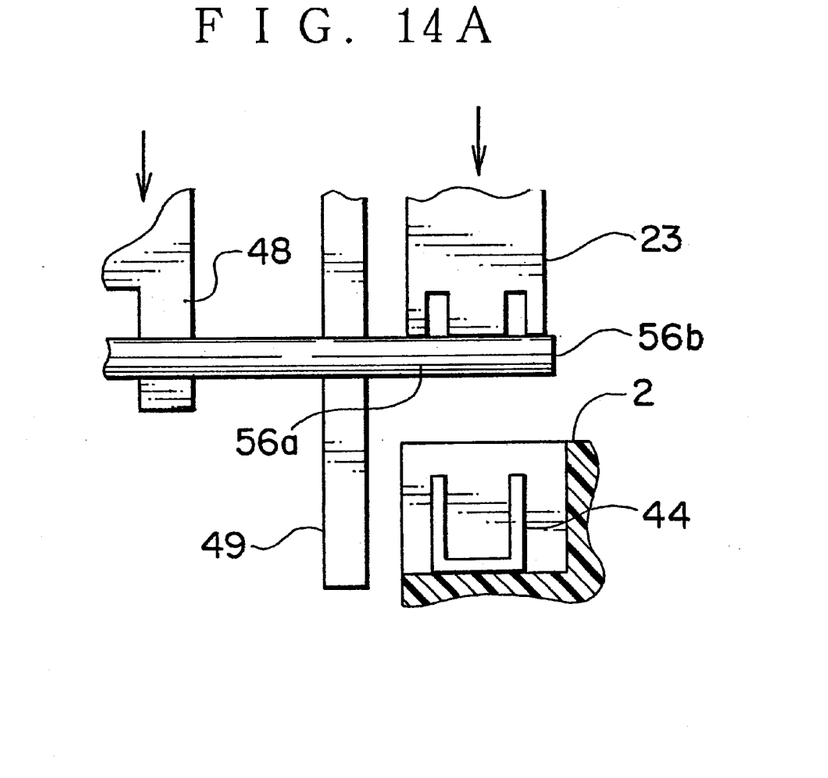
FIG. 14A is a sectional view showing main elements in a state of lowering the wire along the wire guide synchronously with a pressure welding blade.
Figure 14B:
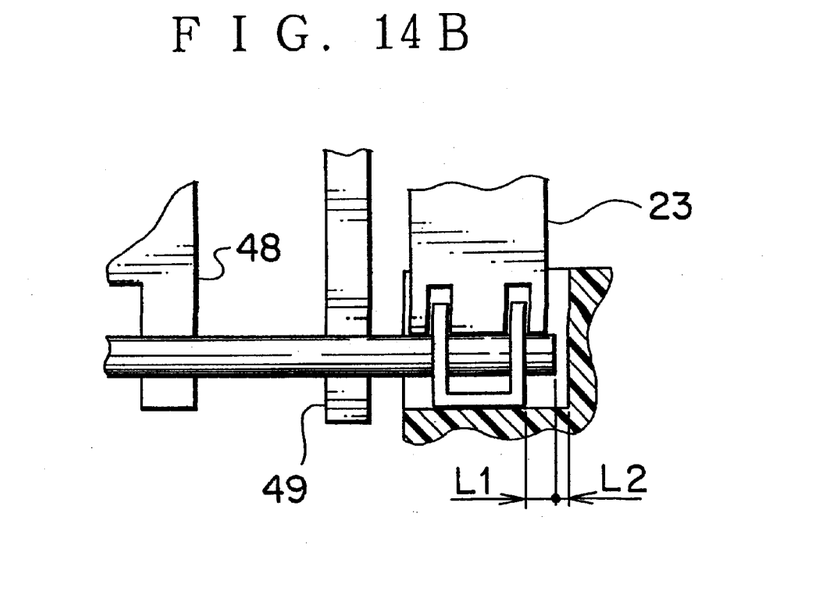
FIG. 14B is a sectional view showing the main elements in a state of completion of pressure welding of the wire.

Next, as shown in FIG. 13, the pressure welding blade 23 descends while the wire chuck 48 descends, by synchronizing a servo-motor 11 for driving the chuck 48 with the servo-motor 33 of the pressure welder 57. This synchronizing operation is controlled by a controller (not shown). As also shown in FIG. 14, the wire 56 held by the wire chuck 48 descends along the wire guide 49 and is presure-welded to the solderless terminal 44 in the connector 2 by the pressure welding blade 23.

According to this embodiment, the wire chuck 48 can descend deeper as shown in FIG. 13 than the previous one since the chuck 48 has not a forwardly projecting portion like the wire guide portion 40 formed on the previous wire chuck 3, whereby the wire 56 can be presure-welded in a straight and horizontal state.

This action may be performed without the wire guide 49, however, the slit 61 (FIG. 11) of the guide 49 can ensure more exact positioning and presure welding of the wire 56 by stabilizing the wire 56 during the descent Further, according to the mechanism with the wire chuck 48 and the wire guide 49, pressure welding operation from the right or left can be surely performed besides the above-mentioned operation from the upper or lower side due to wire's stabilization which can not be obtained with the prior art mechanism (the wire pushing plate 73 in FIG. 15) of only pushing a wire from the upper side.

What is claimed is:

1. An electric wire pressure welding apparatus comprising:

a wire pressure welding blade being capable of moving in up and down directions;

a wire chuck being also capable of moving in up and down directions;

a wire holding portion provided on said wire chuck; and a pair of wire guide portions each projecting from said wire holding portion in a wire-longitudinal direction and having an inner distance larger than a diameter of an electric wire, wherein a wire end portion is disposed between said pair of wire guide portions and said wire pressure welding blade can go through said pair of wire guide portions.

2. The electric wire pressure welding apparatus as set forth in claim 1, wherein both said wire pressure welding blade and said wire chuck are provided both above and below a solderless connector for enabling pressure welding form above and below said solderless connector.

3. An electric wire pressure welding apparatus comprising:

a wire pressure welding blade being capable of moving in up and down directions; and a wire chuck, in a state of holding an electric wire, being also capable of moving in up and down directions, wherein said wire chuck is capable of moving synchronously with said wire pressure welding blade in said up and down directions.

4. The electric wire pressure welding apparatus as set forth in claim 3, further comprising a wire guide provided between said wire pressure welding blade and said wire chuck and extending in a moving direction of said blade, wherein said electric wire can move along said wire guide.

5. The electric wire pressure welding apparatus as set forth in claim 4, wherein said wire pressure welding blade, said wire chuck, and said wire guide are provided both above and below a solderless connector for enabling pressure welding form above and below said solderless connector.

6. An electric wire pressure welding method with said pressure welding apparatus as set forth in either one of claim 1 or claim 2, comprising the steps of:

positioning said pair of wire guide portions against a solderless terminal by shifting said wire chuck holding said electric wire;

pushing said wire end portion by said wire pressure welding blade for bending said wire end portion about a front end of said wire holding portion in a pressure welding direction, while guiding said wire end portion with said wire guide portions;

specifying location of a wire tip on said solderless terminal; and pressure-welding said wire by said blade to said solderless terminal.

7. The electric wire pressure welding method with said pressure welding apparatus as set forth in either one of claim 3 or claim 4, comprising the step of:

shifting said wire chuck, in a state of holding said electric wire, synchronously with said wire pressure welding blade in said moving direction thereof upon pressure welding.

* * * * *